(12) United States Patent
Terao

(10) Patent No.: US 8,497,500 B2
(45) Date of Patent: Jul. 30, 2013

(54) ORGANIC EL DEVICE

(75) Inventor: Yutaka Terao, Matsumoto (JP)

(73) Assignee: Sharp Kabushiki Kaisha (JP)

( * ) Notice: Subject to any disclaimer, the term of this patent is extended or adjusted under 35 U.S.C. 154(b) by 320 days.

(21) Appl. No.: 12/922,139

(22) PCT Filed: Apr. 21, 2009

(86) PCT No.: PCT/JP2009/057933
§ 371 (c)(1),
(2), (4) Date: Jan. 24, 2011

(87) PCT Pub. No.: WO2009/139275
PCT Pub. Date: Nov. 19, 2009

(65) Prior Publication Data
US 2011/0140089 A1 Jun. 16, 2011

(30) Foreign Application Priority Data

May 13, 2008 (JP) .................. 2008-126154

(51) Int. Cl.
*H01L 35/24* (2006.01)
(52) U.S. Cl.
USPC .................. 257/40; 257/E51.001
(58) Field of Classification Search
USPC ............................ 257/40, E51.001
See application file for complete search history.

(56) References Cited

U.S. PATENT DOCUMENTS 6,720,573 B2 4/2004 Son et al.
2001/0046611 A1 11/2001 Kido et al.
(Continued)

FOREIGN PATENT DOCUMENTS

JP 4-297076 A 10/1992
JP 11-251067 A 9/1999
(Continued)

OTHER PUBLICATIONS

International Search Report, dated Aug. 11, 2009, issued in corresponding application No. PCT/JP2009/057933.
(Continued)

*Primary Examiner* — Anthony Ho
(74) *Attorney, Agent, or Firm* — Rossi, Kimms & McDowell LLP

(57) ABSTRACT

The object of the present invention is to provide an organic EL device having a structure that resolves a problem of trade-off between decrease in a drive voltage and increase in production yield. The organic EL device of the present invention includes a substrate, a pair of electrodes provided on the substrate, and an organic EL layer sandwiched by the pair of electrodes; the pair of electrodes includes a positive electrode and a negative electrode; the organic EL layer includes at least a light-emitting layer and a hole injection layer that is in contact with the positive electrode; the hole injection layer is formed of an n-type semiconductor host material and a p-type semiconductor guest material; a LUMO level $E_{HIC}$ of the host material and a HOMO level of the guest material or a valence band level $E_{GV}$ satisfy:

$|E_{HIC}|+0.5 \text{ eV} \geq |E_{GV}| > |E_{HIC}|-0.6 \text{ eV}.$

10 Claims, 5 Drawing Sheets

U.S. PATENT DOCUMENTS

| | | |
|---|---|---|
| 2004/0062949 A1 | 4/2004 | Pfeiffer et al. |
| 2004/0251816 A1 | 12/2004 | Leo et al. |
| 2005/0142384 A1 | 6/2005 | Itai |
| 2007/0141396 A1 | 6/2007 | Chun et al. |
| 2008/0118724 A1 | 5/2008 | Cina et al. |
| 2009/0096354 A1 | 4/2009 | Vaufrey et al. |

FOREIGN PATENT DOCUMENTS

| | | |
|---|---|---|
| JP | 2000-223276 A | 8/2000 |
| JP | 2003-519432 A | 6/2003 |
| JP | 2004-514257 A | 5/2004 |
| JP | 2004-537149 A | 12/2004 |
| JP | 2007-173780 A | 7/2007 |
| WO | 2004/091262 A1 | 10/2004 |
| WO | 2006/056586 A1 | 6/2006 |
| WO | 2006/131565 A1 | 12/2006 |
| WO | 2007105906 A1 | 9/2007 |

OTHER PUBLICATIONS

Chih-Wei, Chu, et al.; High-Performance Organic Thin-Film Transistors with Metal Oxide/Metal Bilayer Electrode, Applied Physics Letters, vol. 87, Issue 19, (Nov. 7, 2005), Article 193508, pp. 1-3.

Kido, Junji, et al., Bright Organic Electroluminescent Devices Having a Metal-Doped Electron-Injecting Layer, Applied Physics Letters, vol. 73, No. 20, (Nov. 16, 1998), pp. 2866-2868.

Pfeiffer, M., et al., Doped Organic Semiconductors: Physics and Application in Light Emitting Diodes, Organic Electronics, vol. 4, Issue 2-3, (Sep. 2003), pp. 89-103.

You, Han, et al., Improved Performances of Organic Light-emitting Diodes with Metal Oxide as Anode Buffer, Journal of Applied Physics, vol. 101, Issue 2, (Jan. 15, 2007), Article 026105, pp. 1-3.

ORGANIC EL DEVICE

This application is a U.S. National Phase Application of PCT International Application PCT/JP2009/057933 filed on Apr. 21, 2009 which is based on and claims priority from JP 2008-126154 filed on May 13, 2008, the contents of which is incorporated herein in its entirety by reference.

TECHNICAL FIELD

The present invention relates to an organic EL device that can be applied to flat panel displays and light sources for illumination. In particular, it is an object of the present invention to provide an organic electroluminescence device that operates at a low drive voltage and has low power consumption.

BACKGROUND ART

Organic electroluminescence devices (referred to hereinbelow as organic EL devices) have been actively researched in recent years with the object of putting them to practical use. Organic EL devices can realize a high current density at a low voltage and are therefore expected to realize high emission luminance and emission efficiency. The organic EL device is provided with a first electrode and a second electrode that sandwich an organic EL layer, and the electrode on the light take-out side is required to have high transmittance transparent conductive oxide film (TCO) materials (for example, indium tin oxide (ITO), indium zinc oxide (IZO), and indium tungsten oxide (IWO)) are usually used as the electrode materials, and because these materials have a comparatively high work function of about 5 eV, they are used as hole injection electrodes (positive electrodes) for injecting holes into the organic material.

FIG. 1 shows a cross-sectional view illustrating an example of the conventional organic EL device using the conventional hole injection layer, and FIG. 2 illustrates the hole injection process. Emission in the organic EL device is obtained due to light emission occurring during excitation energy relaxation of excitons generated by holes injected from a positive electrode 202 provided on the substrate 201 into a highest occupied molecular orbital (HOMO) of the material of the light-emitting layer 205 and electrons injected from a negative electrode 207 into the lowest unoccupied molecular orbital (LUMO). The organic EL layer includes at least the light-emitting layer 205. In order to inject holes and electrons efficiently into the light-emitting layer, the organic EL layer typically has a stratified structure including a carrier transport layer in addition to the light-emitting layer. The carrier transport layer may also include any of a hole injection layer 203, hole transport layer 204, electron transport layer 206, and electron injection layer or all of these layers. In this case, as shown in FIG. 2, the injection is conducted from a Fermi level $E_F$ of the positive electrode 202 into the HOMO of the light-emitting layer 205 via the HOMO of the hole injection layer 203 and the HOMO of the hole transport layer 204.

A technique for increasing the effective mobility of carriers, reducing a barrier for carrier injection from the electrodes, and thus decreasing the drive voltage of the device by doping a carrier transport layer with a dopant in the organic EL device having the organic EL layer of the above-described stratified structure with the object of further reducing power consumption of the organic EL device has recently been disclosed in Japanese Patent Application Laid-open No. H4-297076, Japanese Patent Application Laid-open No. H11-251067, Japanese Translation of PCT Application No. 2004-514257, Organic Electronics, Vol. 4, Issues 2-3 (September 2003), page 89, and Applied Physics Letters, Vol. 73, Issue 20 (November 1998), page 2866 (see Patent Documents 1-3 and Non-Patent Documents 1 and 2).

With this technique, which is similar to p-type doping and n-type doping of inorganic semiconductors, in a case of hole injection layer or hole transport layer, by admixing a material with high electron accepting ability (acceptor) to a hole transport material constituting this layer, it is possible to reduce a barrier to hole injection from the electrode (reduce the difference between the work function of the positive electrode and the HOMO level of the adjacent hole transport material) and increase the effective mobility of holes, and in a case of electron injection layer or electron transport layer, by admixing a material with high electron donating ability (donor), it is possible to reduce a barrier to electron injection from the electrode (reduce the difference between the work function of the negative electrode and the LUMO level of the adjacent electron transport material) and increase the effective mobility of electrons.

A technique has also been suggested by which the driving voltage of the organic EL device is reduced by using an n-type semiconductor with a deep LUMO level or conduction band level in the hole injection layer and increasing the injection capacity of holes from the positive electrode. For example, Japanese Patent Application Laid-open No. 2000-223276, Applied Physics Letters, Vol. 87, Issue 19 (Nov. 7, 2005), Articles 193508, and Journal of Applied Physics, Vol. 101, Issue 2 (Jan. 15, 2007), Articles 026105 suggest techniques using an n-type inorganic semiconductor (see Patent Document 4 and Non-Patent Documents 3 and 4). Further, Japanese Translation of PCT Application No. 2003-519432 suggests a technique using an n-type organic semiconductor (see Patent Document 5; in Japanese Translation of PCT Application No. 2003-519432, the disclosed organic semiconductor material functions as a p-type semiconductor, but is actually an n-type semiconductor). FIG. 3 is a cross-sectional view illustrating an example of the conventional organic EL device using an n-type semiconductor hole injection layer, and FIG. 4 shows a hole injection process therein. The organic EL device shown in FIG. 3 has a positive electrode 302, an n-type semiconductor hole injection layer 303, a hole transport layer 304, a light-emitting layer 305, an electron transport layer 306, and a negative electrode 307 on a substrate 301. The injection of electrons from the negative electrode 307 into the LUMO of the light-emitting layer 305 via the electron transport layer 306 is conducted by a process similar to that in the conventional organic EL device (for example, the device shown in FIG. 1). The holes are formed because the electrons of HOMO of the hole transport layer 304 move to the LUMO to the n-type semiconductor hole injection layer 303 and leave holes in the HOMO of the hole injection layer 304. In this case, the electrons that have moved to the LUMO of the n-type semiconductor hole injection layer 303 are moved to the Fermi level $E_F$ of the positive electrode 302, and the holes of the HOMO of the hole transport layer 304 are moved to the HOMO of the light-emitting layer 305 by the electric field applied by the positive electrode 302 and negative electrode 307. As a total, with such a structure, hole injection is conducted from the positive electrode 302 to the light-emitting layer 305. In FIG. 4, the movement of holes is shown by a broken arrow and the movement of electrons is shown by a solid arrow (same hereinbelow).

In such a technique, the Fermi energy is matched among the positive electrode—hole injection material—hole transport material by introducing the aforementioned hole injection layer composed of the n-type semiconductor between the positive electrode and hole transport layer. In this process, the hole injection ability is increased by reducing a barrier for the charge movement at the layer interface. As a result, the drive voltage of the organic EL device decreases.

As for the movement of holes occurring when a voltage is applied to the organic EL device using such a technique, the electrons located on the HOMO (or valence band) of the hole transport layer move to the LUMO (or conduction band) of the hole injection layer and holes are generated in the hole transport layer. The electrons that have entered the hole injection layer are transported via the LUMO (or conduction band) level toward the positive electrode, eventually enter the Fermi level of the positive electrode, and are detected as an electric current. Meanwhile, the holes generated in the hole transport layer move inside the hole transport layer and are injected into the light-emitting layer and used to generate excitons. The technique for reducing the drive voltage of the organic EL device that uses the n-type semiconductor in the hole injection layer is especially effective when a gap between the Fermi level of the positive electrode material and the HOMO (or valence band) level of the hole transport layer is large.

Patent Document 1: Japanese Patent Application Laid-open No. H4-297076
Patent Document 2: Japanese Patent Application Laid-Open No. H11-251067
Patent Document 3: Japanese Translation of PCT Application No. 2004-514257
Patent Document 4: Japanese Patent Application Laid-Open No. 2000-223276
Patent Document 5: Japanese Translation of PCT Application No. 2003-519432
Non-Patent Document 1: Organic Electronics, Vol. 4, Issues 2-3 (September 2003), page 89
Non-Patent Document 2: Applied Physics Letters, Vol. 73, Issue 20 (November 1998), page 2866
Non-Patent Document 3: Applied Physics Letters, Vol. 87, Issue 19 (Nov. 7, 2005), Articles 193508
Non-Patent Document 4: Journal of Applied Physics, Vol. 101, Issue 2 (Jan. 15, 2007), Articles 026105

A means for reducing the thickness of the entire organic EL layer can be considered as a simple method for decreasing the drive voltage of the organic EL device. However, when the thickness of the entire layer is reduced, it can easily induce device defects by a short circuit between the positive electrode and negative electrode caused by particles that have adhered to the substrate. In particular, a large number of pixel defects and/or line defects appear in a flat panel display and the production yield of display panel decreases significantly. Therefore, from the standpoint of increasing the production yield, it is preferred that the thickness of the entire organic EL device be large, but this results in increased drive voltage. Thus, there is a tradeoff between a problem of reducing the drive voltage and a problem of increasing the yield.

When the effective mobility of carriers is increased and the driving voltage is decreased by doping a carrier transport layer with a dopant, as with the conventional technique, the following problem is encountered. Alkali metals such as Li and Cs or alkali metal salts such as LiF, CsF, $LiO_2$, and $Cs_2CO_3$ are typically used as dopants in the electron transport layer. However, these materials have low stability in the air and require attention in handling. In addition, in most cases, an expensive vapor deposition source is required. Furthermore, because of their small atomic radii (subnanometer order), alkali metals easily migrate in the organic EL layer and can contaminate other layers constituting the organic EL layer. The possibility of using organic materials with a larger size (nanometer order) and having a comparatively shallow HOMO instead of the aforementioned materials has been studied, but such organic materials are instable and the effect obtained therewith is small.

A problem associated with the configuration using the n-type semiconductor as the hole injection layer is that the electron mobility of the n-type semiconductor is not necessarily high. Therefore, when the thickness of the hole injection layer is increased, an electric resistance rises. As a result, the drive voltage increases.

Further, a reflection component at the interface occurring when light is emitted from the device is especially large in an organic EL device using a low-molecular material. This is because the organic EL layer material and the transparent conductive film used for the electrode have a high refractive index (about n=1.8 to 2.1) and a difference in refractive index between them and a medium (for example glass having a refractive index of about 1.5 and air having a refractive index of about 1) that is in contact with the organic EL device is large. In addition, the emission spectrum and emission luminance of the organic EL device are strongly affected by multiple interference of light in the device. Therefore, from the optical standpoint, the thickness of the entire organic EL layer has to be designed so as to obtain the desired emission spectrum and sufficient emission luminance. However, it is somewhat difficult to design the thickness of each layer with consideration for the effect produced on the drive voltage and the balance of holes and electrons inside the light-emitting layer. In particular, in some cases, when the thickness is designed to obtain a sufficient yield, as described above, the drive voltage rises significantly.

DISCLOSURE OF THE INVENTION

The present invention is based on employing the technique of greatly reducing a barrier to hole injection from the positive electrode by using an n-type semiconductor material in the hole injection layer, wherein the carrier transport capacity is further increased by doping the n-type semiconductor material with an n-type dopant. More specifically, the hole injection layer is configured by doping an n-type semiconductor (material capable of transporting electrons) having a LUMO level equal to or lower than the HOMO level of the adjacent layer material with a guest material having a HOMO level equal to or higher than the LUMO level of the host material.

An organic EL device in accordance with the present invention includes a substrate, a pair of electrodes provided on the substrate, and an organic EL layer sandwiched by the pair of electrodes, wherein the pair of electrodes includes a positive electrode and a negative electrode, the organic EL layer includes at least a light-emitting layer and a hole injection layer that is in contact with the positive electrode, the hole injection layer is formed of an n-type semiconductor host material and a p-type semiconductor guest material, and a LUMO level $E_{HIC}$ of the host material and a HOMO level of the guest material or a valence band level $E_{GV}$ satisfy:

$$|E_{HIC}|+0.5\ eV \geq |E_{HIC}| > |E_{HIC}|-0.6\ eV.$$

Such a configuration may additionally include a hole transport layer adjacent to the hole injection layer and light-emitting layer and it is preferred that a LUMO level of the hole transport layer be higher than a LUMO level of the light-emitting layer. Further, it is preferred that (a) a LUMO level $E_{HIC}$ of the host material of the hole injection layer and a HOMO level $E_{EMV}$ of the light-emitting layer adjacent to the hole injection layer satisfy the relationship:

$$|E_{HIC}| > |E_{EMV}|-1.0\ eV,$$

or (b) a LUMO level $E_{HIC}$ of the host material of the hole injection layer and a HOMO level $E_{HTV}$ of the hole transport layer satisfy the relationship:

$$|E_{HIC}|>|E_{HTV}|-1.0\ eV.$$

When the (a) or (b) relationship is satisfied, it is desirable that (c) the absolute value $|E_{HIC}|$ of $E_{HIC}$ be equal to or higher than 5.0 eV. It is also desirable that a concentration of the guest material of the hole injection layer be equal to or less than 50 mol % based on the total number of molecules in the hole injection layer.

In the organic EL device in accordance with the present invention, the host material of the hole injection layer is preferably a hexaazatriphenylene derivative having a structure represented by the following Formula (1)

[C1]

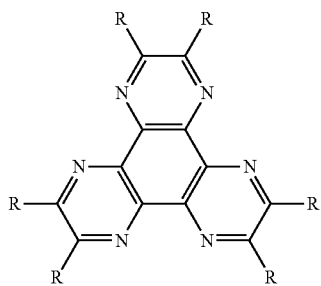

(1)

(where R is selected, in each appearance thereof, from the group consisting of a hydrogen atom, a hydrocarbon group having 1 to 10 carbon atoms, a halogen, an alkoxy group, an arylamino group, an ester group, an amido group, an aromatic hydrocarbon group, a heterocyclic group, a nitro group, and a cyano group), in particular hexaazatriphenylene hexacarbonitrile having a structure represented by the following Formula (2)

[C2]

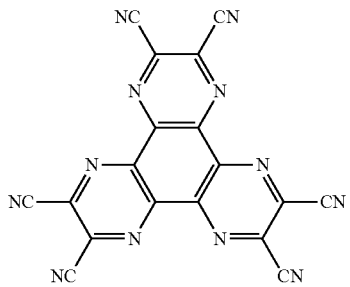

(2)

Further, the host material of the hole injection layer is preferably selected from the group consisting of molybdenum oxide ($MoO_3$), tungsten oxide ($WO_3$), and vanadium oxide ($V_2O_5$).

In the configuration in accordance with the present invention, the hole injection layer is constituted by a host material formed of an n-type semiconductor material and a guest material formed of a p-type semiconductor, and because the p-type semiconductor functions as an n-type dopant in the host material, it is possible to obtain a hole injection layer having excellent hole injection capacity and electron transport capacity. The hole injection layer in accordance with the present invention has high electron mobility. Therefore, the layer thickness can be increased, without raising the device drive voltage. The increase in film thickness suppresses the occurrence of defects caused by particles present on the substrate, increases productivity, and makes it possible to produce organic EL devices with a high yield. Further, since the degree of freedom in designing the film thickness is increased, it is possible to design an organic EL layer with consideration for optical interference, without sacrificing the hole-electron balance in the light-emitting layer and drive voltage. In addition, the excellent hole injection capacity and hole transport capacity of the hole injection layer provide an organic EL device with a low drive voltage and long service life.

Figure 1:
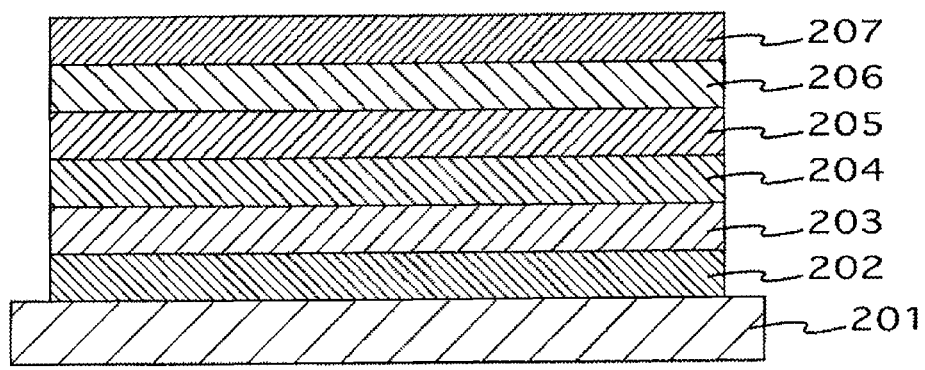
FIG. 1 is a cross-sectional view illustrating an example of the conventional organic EL device using a conventional hole injection layer.
Figure 2:
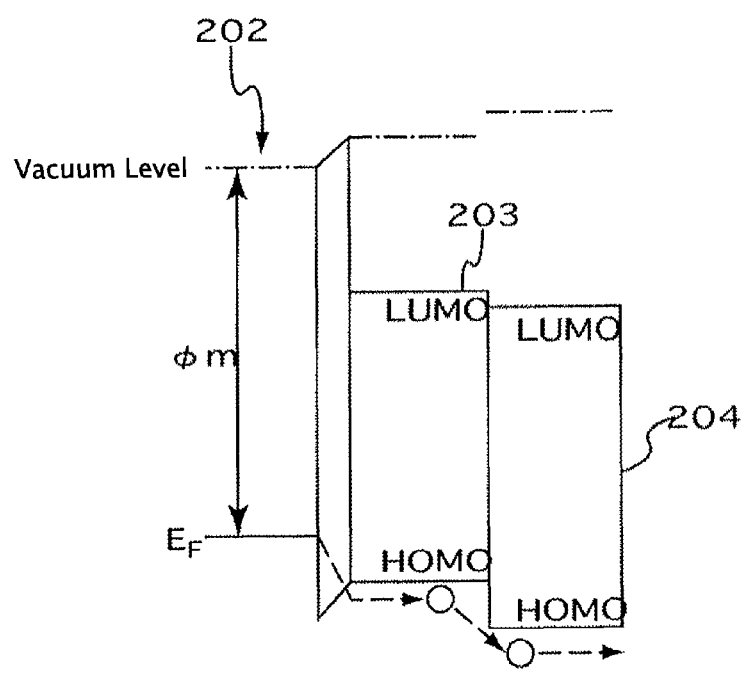
FIG. 2 is a cross-sectional view illustrating a hole injection process in the conventional organic EL device using a conventional hole injection layer.
Figure 3:
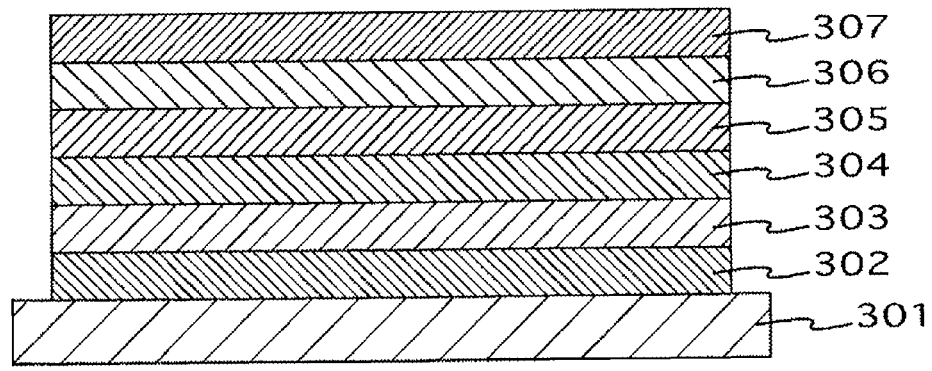
FIG. 3 is a cross-sectional view illustrating an example of the conventional organic EL device using an n-type semiconductor hole injection layer.
Figure 4:
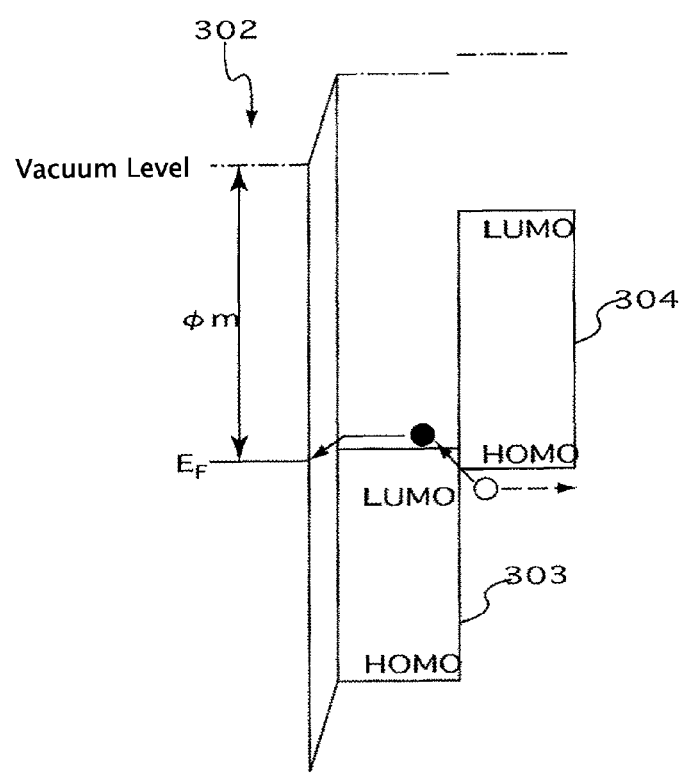
FIG. 4 is a cross-sectional view illustrating a hole injection process in the conventional organic EL device using an n-type semiconductor hole injection layer.

EXPLANATION OF REFERENCE NUMERALS 101, 201, 301 substrate
102, 202, 302 positive electrode
103 hole injection layer composed of n-type doped n-type semiconductor
203 n-type semiconductor hole injection layer
303 conventional hole injection layer
104, 204, 304 hole transport layer
105, 206, 306 light-emitting layer
106, 206, 306 electron transport layer
107, 207, 307 negative electrode

BEST MODE FOR CARRYING OUT THE INVENTION

An organic EL device in accordance with the present invention includes a substrate, a pair of electrodes provided on the substrate, and an organic EL layer sandwiched by the pair of electrodes, wherein the pair of electrodes includes a positive electrode and a negative electrode, the organic EL layer includes at least a light-emitting layer and a hole injection layer that is in contact with the positive electrode, and the hole injection layer is composed of an n-type semiconductor host material and a p-type semiconductor guest material.

The organic EL layer in accordance with the present invention includes as the necessary structural elements the hole injection layer constituted by the host material composed of an n-type semiconductor material and the guest material composed of a p-type semiconductor, and the light-emitting layer emitting light due to recombination of holes and electrons. The organic EL layer may further include a hole transport layer, an electron transport layer, and/or an electron injection layer. For example, the organic EL layer in accordance with the present invention can have the following layered configurations:

(A) positive electrode/hole injection layer/light-emitting layer/negative electrode;

(B) positive electrode/hole injection layer/light-emitting layer/electron injection layer/negative electrode;

(C) positive electrode/hole injection layer/hole transport layer/light-emitting layer/electron injection layer/negative electrode;

(D) positive electrode/hole injection layer/light-emitting layer/electron transport layer/electron injection layer/negative electrode;

(E) positive electrode/hole injection layer/hole transport layer/light-emitting layer/electron transport layer/negative electrode;

(F) positive electrode/hole injection layer/hole transport layer/light-emitting layer/electron transport layer/electron injection layer/negative electrode.

Among the above-described exemplary configurations, the (A), (B), and (D) configurations in which the hole injection layer and light-emitting layer are in direct contact with each other preferably have a material configuration or barrier configuration (for example, a relationship between the Fermi level of the negative electrode and a LUMO (conduction band) level of the light-emitting layer and electron transport layer) such that the electrons injected from the negative electrode do not reach the hole injection layer via the light-emitting layer. When the electrons pass through the light-emitting layer and reach the hole injection layer, the electrons enter the LUMO level of the hole injection layer, reach the positive electrode, without recombining with holes (that is, exciton generation and subsequent light emission), and decrease the emission efficiency of the organic EL device. By using the above-described configurations, it is possible to prevent the decrease of emission efficiency of the organic EL device based on the above-described structure.

Figure 5:
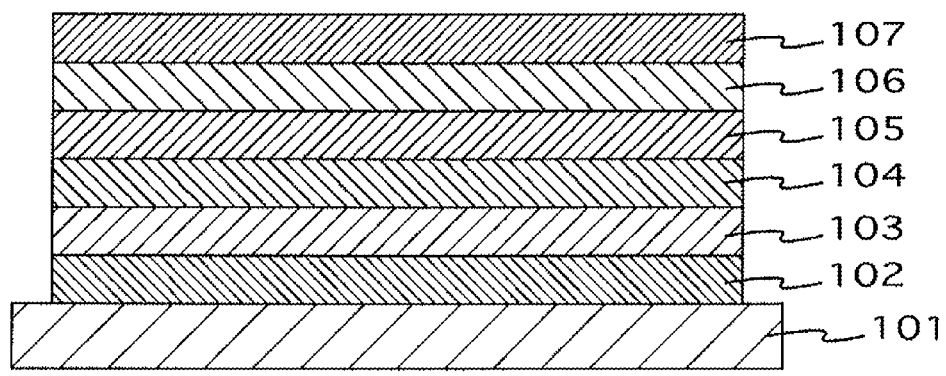
FIG. 5 is a cross-sectional view illustrating an example of an organic EL device in accordance with the present invention that uses an n-type doped n-type semiconductor hole injection layer.
Figure 6:
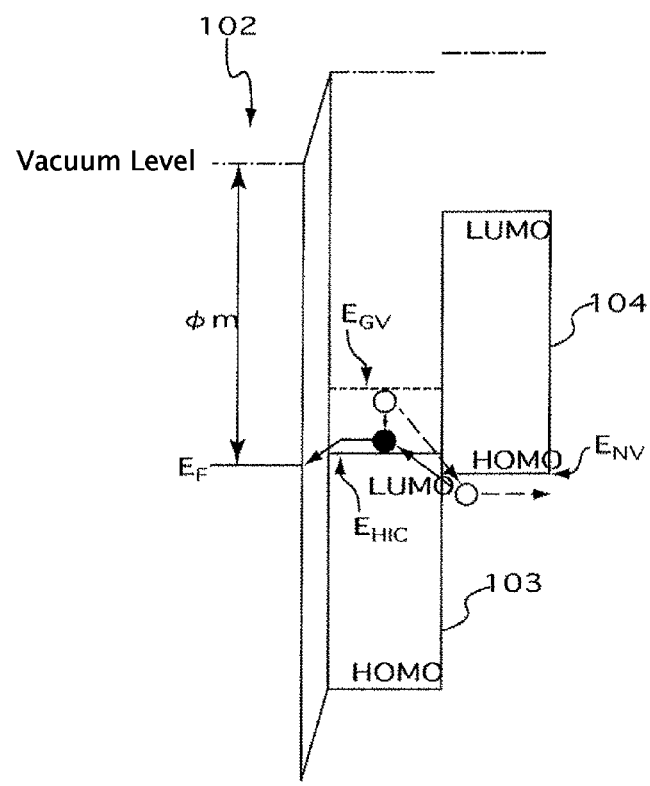
FIG. 6 is a cross-sectional view illustrating a hole injection process in an organic EL device in accordance with the present invention that uses an n-type doped n-type semiconductor hole injection layer.

FIG. 5 is a cross-sectional view illustrating an example of the organic EL device in accordance with the present invention. The organic EL device shown in FIG. 5 has an organic EL layer of the above-described (E) configuration and has a configuration in which a positive electrode 102, a hole injection layer 103 composed of an n-type doped n-type semiconductor, a hole transport layer 104, a light-emitting layer 105, an electron transport layer 106, and a negative electrode 107 are stratified in the order of description on a substrate 101. FIG. 5 shows an example in which the positive electrode 102 is used as a first electrode disposed in direct contact with the substrate 101, but the negative electrode 107 may be also used as the first electrode. In this case, the lamination order from the substrate 101 side will be as follows: negative electrode 107, electron transport layer 306, light-emitting layer 105, hole transport layer 104, hole injection layer 103, and positive electrode 102.

Either of the positive electrode 102 and negative electrode 107 has to be a light-transmitting electrode in order to take the light from the light-emitting layer to the outside. In order to increase the light out-coupling efficiency, it is preferred that the other electrode be a light-reflecting electrode. Which of the positive electrode 102 and negative electrode 107 is to be made light transmitting and which light reflecting can be appropriately selected according to the application.

Structural components of the organic EL device in accordance with the present invention will be described below.

[Substrate 101]

The substrate 101 in accordance with the present invention can be formed using materials that have been generally used as support substrates for flat panel displays. For example, the transparent substrate 101 can be formed using a transparent material such as glass (alkali-free, alkali) or a plastic such as a polycarbonate. The term "transparent" in accordance with the present invention means a light transmissivity of equal to or higher than 50% within a wavelength range of 400 to 700 nm. Alternatively, a functional substrate in which a layer such as a black matrix, a color filter layer, a color conversion layer, a planarizing layer, and a passivation layer are provided on a support body formed using the aforementioned transparent material may be also used as the substrate 101. These additional layers are useful for forming an organic EL device that enables the multicolor display.

Further, it is not necessary for the substrate 101 to be transparent. Therefore, the substrate 101 can be formed using a non-transparent material such as silicon or ceramics. Further, a plastic substrate, a glass substrate, or a silicon substrate having a plurality of switching elements (TFT and the like) formed thereon may be also used as the substrate 101.

[Positive Electrode 102]

As described hereinabove, the positive electrode 102 used in accordance with the present invention may be light transmitting or light reflecting. In the case of a light-transmitting electrode, the positive electrode 102 can be formed using transparent conductive materials that have been generally used. Examples of transparent conductive film materials that can be used include transparent conductive oxide materials such as ITO (indium tin oxide), IZO (indium zinc oxide), IWO (indium tungsten oxide), and AZO (Al-doped zinc oxide) and highly conductive polymer materials such as poly (3,4-ethylenedioxythiophene)poly(styrene sulfonate) (PEDOT:PSS). Further, with the object of reducing the electric resistance of the positive electrode wiring and/or control reflectivity and transmittance, a stratified structure can be used that includes a thin metal material film (film thickness equal to or less than about 50 nm) and the above-described transparent conductive material film.

When the light-reflecting positive electrode 102 is formed, it is possible to use a reflective material such as a metal, an amorphous alloy, or a microcrystalline alloy with a high reflectance. The positive electrode 102 also may have a stratified structure of the aforementioned reflective material film and the aforementioned transparent conductive material film. Examples of metals with a high reflectance include Al, Ag, Ta, Zn, Mo, W, Ni, and Cr. Examples of amorphous alloys with a high reflectance include NiP, NiB, CrP, and CrB. Examples of microcrystalline alloys with a high reflectance include NiAl and Ag alloys.

Films of the transparent conductive oxide materials, and metals, amorphous alloys, and microcrystalline alloys with a high reflectance can be formed by any method well known in the pertinent field such as vapor deposition and sputtering. A film of a high-conductivity polymer material such as PEDOT:

PSS can be formed by any method well known in the pertinent field such as spin coating and ink jet printing.

[Negative Electrode 107]

The negative electrode 107 can be formed using a metal with a low work function (equal to or less than 4.0 eV), an alloy with a low work function, an electrically conductive compound with a low work function, and mixtures thereof. Specific examples of these materials include sodium, sodium-potassium alloys, magnesium, lithium, magnesium-silver alloys, aluminum/aluminum oxide, aluminum lithium alloys, indium, and rare earth metals.

The negative electrode 107 also may be either light transmitting or light reflecting, as mentioned hereinabove. When the light-transmitting negative electrode 107 is preferred, a stratified structure of a thin film (film thickness equal to or less than about 10 nm) of the aforementioned material and a film of the aforementioned transparent conductive oxide material can be used as the negative electrode. When the light-reflecting negative electrode 107 is preferred, the negative electrode 107 may be a single thin film of the aforementioned material with a low work function. Alternatively, the negative electrode 107 may have a stratified structure of a thin film of the aforementioned material with a low work function and a film of the aforementioned reflecting material.

A film of the aforementioned material with a low work function can be produced by any method well known in the pertinent field such as vapor deposition and sputtering.

[Shape of the Electrodes]

The positive electrode 102 and negative electrode 107 in accordance with the present invention may be formed as integral films. In this case, the organic EL device in accordance with the present invention can be used as a light source with planar emission. Alternatively, either of the positive electrode 102 and negative electrode 107 or both electrodes are divided into a plurality of partial electrodes, thereby making it possible to obtain an organic EL device having a plurality of independently controllable light-emitting portions.

For example, an organic EL device of a passive matrix drive type can be obtained by configuring both the positive electrode 102 and the negative electrode 107 of a plurality of stripe-like partial electrodes and crossing the extension direction of the stripe-like partial electrodes of the positive electrode 102 with the extension direction of the stripe-like partial electrodes of the negative electrode 107. In this case, it is preferred that the extension direction of the stripe-like partial electrodes of the positive electrode 102 be perpendicular to the extension direction of the stripe-like partial electrodes of the negative electrode 107.

Alternatively, an electrode, from among the positive electrode 102 and negative electrode 107, that is formed on the substrate 101 side (substrate side electrode) may be formed as a partial electrode composed of a plurality of portions and the other electrode (counter electrode) may be formed as an integral common electrode. In this case, an organic EL device of an active matrix drive type can be obtained by connecting the partial electrodes of the substrate electrode at a one-to-one ratio to a plurality of switching elements that may be provided on the substrate 101.

[Organic EL Layer]

Each constituent layer of the organic EL layer will be described below in greater detail. Each constituent layer can be produced using any means that has been known in the pertinent field, such as evaporation (resistance heating vapor deposition or electron beam evaporation).

[Hole Injection Layer 103]

The hole injection layer 103 in accordance with the present invention is constituted by a host material component of an n-type semiconductor and a guest material composed of a p-type semiconductor. The host material has a LUMO level $E_{HIC}$ equal to or lower than a HOMO level $E_{NV}$ of the adjacent constituent layer material of the organic EL layer (a HOMO level $E_{EMV}$ of the light-emitting layer when the hole injection layer is adjacent to the light-emitting layer and a HOMO level $E_{HTV}$ of the hole transport layer when the hole injection layer is adjacent to the hole transport layer). The expression "the adjacent constituent layer material of the organic EL layer" means a layer that is in contact on the side of the hole injection layer 103 that is opposite that of the positive electrode 102 and is the light-emitting layer 105 in the aforementioned (A), (B), and (D) configurations and the hole transport layer 104 in the (C) and (E) (configurations shown in FIG. 5) and (F) configurations. In the object configuration of the present invention, a HOMO level of each constituent layer is usually a negative numerical value and the absolute value thereof corresponds to an ionization potential ($I_p$) measured by a photoelectronic spectrometer for conducting measurements in the air (for example, AC-2 manufactured by Riken Keiki Co., Ltd.). A LUMO level of each constituent layer can be calculated by using the ionization potential measured in the above-described manner and a measured value of a band gap obtained by light absorption.

The HOMO and LUMO levels of a material in an amorphous state are split into a plurality of energy levels by an orbital interaction of a plurality of molecules, the levels are distributed according to the usual Gaussian distribution, and respective valence bands and conduction bands are formed. In the present description, the HOMO and valence band in a narrow sense (gas phase state) will be generally referred to as "HOMO" and the LUMO and conduction band in a narrow sense (gas phase state) will be referred to as "LUMO". Where the distribution of the above-described HOMO and LUMO levels is taken into account, by satisfying the relationship represented by Formula (I) below, it is possible to lower a barrier in the process in which electrons present at the HOMO of the adjacent constituent layer of the organic EL layer move to the LUMO of the hole injection layer 103.

$$|E_{HIC}|>|E_{NV}|-1.0\ eV \quad (I)$$

Further, from the standpoint of increasing the degree of freedom in designing the guest material and the material of the adjacent constituent layer of the organic EL layer, it is preferred that the LUMO level $E_{HIC}$ satisfy Formula (II) below:

$$|E_{HIC}|\geq 5.0\ eV \quad (II)$$

In particular, when the desirable emission color of the light-emitting layer is blue, it is preferred that $E_{HIC}$ satisfy Formula (II') below:

$$|E_{HIC}|\geq 5.5\ eV \quad (II')$$

The guest material constituting the hole injection layer 103 has a HOMO level $E_{GV}$ equal to or higher than the LUMO level $E_{HIC}$ of the host material. Where the level distribution is taken into account in the same manner as described above, it is desirable that $E_{GV}$ satisfy the relationship represented by Formula (III) below:

$$|E_{HIC}|+0.5\ eV\geq|E_{GV}|>|E_{HIC}|-0.6\ eV \quad (III).$$

It is even more preferred that $E_{GV}$ satisfy the relationship represented by Formula (III') below:

$$|E_{HIC}|\geq|E_{GV}|>|E_{HIC}|-0.6\ eV \quad (III').$$

Where the relationship represented by Formula (III) is satisfied, electron exchange between the LUMO of the host material and the HOMO of the guest material is facilitated. As a result, the host material and guest material form a charge transfer complex, carrier mobility of the entire hole injection layer 103 increases and the drive voltage of the organic EL device can be decreased. Further, where the relationship represented by Formula (III) is satisfied, the injection of holes into the adjacent constituent layer of the organic EL layer is also facilitated. Further, it is preferred that the hole injection layer 103 in accordance with the present invention includes a guest material with a concentration equal to or less than 50 mol % based on the total number of molecules.

A material that can be used as the host material in the hole injection layer 103 in accordance with the present invention is, for example, a hexaazatriphenylene derivative having a structure represented by the following Formula (1)

[C3]

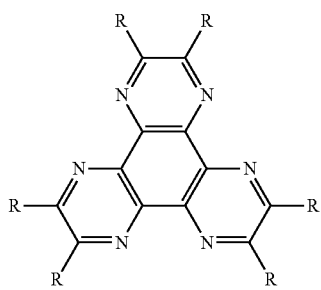

(1)

(where R is selected, in each appearance thereof, from the group consisting of a hydrogen atom, a hydrocarbon group having 1-10 carbon atoms, a halogen, an alkoxy group, an arylamino group, an ester group, an amido group, an aromatic hydrocarbon group, a heterocyclic group, a nitro group, and a cyano group). It is even more preferred that the host material be hexaazatriphenylene hexacarbonitrile (HAT-6CN) having a structure represented by the following Formula (2)

[C4]

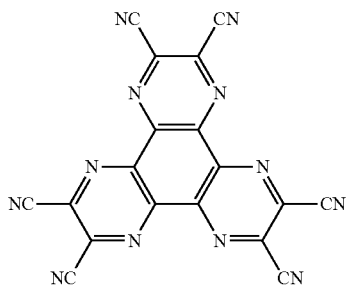

(2)

Alternatively, an organic semiconductor material, for example, a tetracyanoquinodimethane derivative such as 2,3,5,6-tetrafluoro-7,7,8,8-tetracyanoquinodimethane ($F_4$-TCNQ) may be used as the host material of the hole injection layer 103. Further, an n-type inorganic semiconductor such as molybdenum oxide ($MoO_3$), tungsten oxide ($WO_3$), and vanadium oxide ($V_2O_5$) may be used as the host material.

Materials that can be used as the guest material of the hole injection layer 103 are capable of donating electrons to the host material and include hole transport materials of typical organic EL devices. Examples of guest materials that can be used include N,N'-diphenyl-N,N'-bis(3-methylphenyl)-1,1'-biphenyl-4,4'-diamine (TPD), N,N,N'N'-tetrakis(4-methoxyphenyl)-benzidine (MeO-TPD), 4,4',4"-tris{1-naphthyl(phenyl)amino}triphenylamine (1-TNATA), 4,4',4"-tris{2-naphthyl(phenyl)amino}triphenylamine (2-TNATA), 4,4',4"-tris(3-methylphenylphenylamino)triphenylamine (m-MTDATA), 4,4'-bis{N-1-naphthyl)-N-phenylamino}biphenyl (NPB), 2,2',7,7'-tetrakis(N,N-diphenylamino)-9,9'-spirobifluorene (Spiro-TAD), N,N'-di(biphenyl-4-yl)-N,N'-diphenyl-(1,1'-biphenyl)-4,4'-diamine (p-BPD), tri(o-terphenyl-4-yl)amine (o-TTA), tri(p-terphenyl-4-yl)amine (p-TTA), 1,3,5-tris[4-(3-methylphenylphenylamine)phenyl]benzene (m-MTDAPB), and 4,4',4"-tris-9-carbazolyltriphenylamine (TCTA).

The hole injection layer 103 in accordance with the present invention apparently provides holes into adjacent constituent layers of the organic EL layer on the basis of the following mechanism (this is not intended to be tied to any theory).

(a) The electrons located on the HOMO of the adjacent constituent layer of the organic EL layer are pulled to the LUMO of the host material of the hole injection layer 103 and holes are generated in the adjacent constituent layer of the organic EL layer. The pulled-out electrons move to the LUMO of the host material and then move to the Fermi level $E_F$ of the positive electrode 102.

(b) The electrons located on the HOMO of the guest material of the hole injection layer 103 move to the LUMO of the host material and generate holes in the guest material. The electrons that have moved to the host material move along the LUMO of the host material and move to the Fermi level $E_F$ of the positive electrode 102. The holes of the guest material move to the adjacent constituent layer of the organic EL layer and generate holes in the adjacent constituent layer of the organic EL layer.

Since the hole injection layer 103 in accordance with the present invention that has the above-described configuration has high carrier mobility (that is, a low bulk resistance), the film can be made comparatively thick. The increase in thickness of the hole injection layer 103 is effective in terms of preventing device defects induced by a short circuit of the positive electrode and negative electrode caused by particles that have adhered to the substrate 101 and/or electrodes on the substrate (positive electrode 102 in the configuration shown in FIG. 5). However, where a material with a high light absorption coefficient in a visible range (400 to 700 nm) is used as the host material of the hole injection layer 103, the emission of the light-emitting layer 105 is absorbed by the hole injection layer 103 and emission luminance can decrease. In this case, it is preferred that a material with a small light absorption coefficient in the visible range be used as the host material. For example, HAT-6CN, $MoO_3$, and $WO_3$ are the preferred materials.

[Hole Transport Layer 104]

The hole transport layer 104 serves to transport the holes that have moved from the hole injection layer 103 to the light-emitting layer 105. The hole transport layer 104 is provided selectively, but it is very desirable that this layer be provided. When the hole transport layer 104 is present, as in the aforementioned (C), (E), and (F) configurations, the HOMO level $E_{HTV}$ of the hole transport layer 104 is $E_{NV}$ and has to satisfy Formula (I) above. Further, in order to prevent the decrease in emission efficiency, it is preferred that this layer have a function of preventing the electrons present on the LUMO level of the light-emitting layer 105 from flowing out of the light-emitting layer 105. Therefore, it is desirable that the LUMO level $E_{HTC}$ of the hole transport layer 104 and the LUMO level $E_{EMC}$ of the light-emitting layer 105 satisfy Formula (V) below.

$$|E_{EMC}| > |E_{HTC}| \quad (V)$$

The hole transport layer 104 can be formed using any material that is known in the pertinent technology, such as a material having a triarylamine partial structure, a material having a carbazole partial structure, and a material having an oxadiazole partial structure.

Where the hole injection ability of the light-emitting layer 105 is taken into account, it is preferred that the HOMO level $E_{HTV}$ (that is, $E_{NV}$) of the hole transport layer 104 be close to the HOMO level $E_{EMV}$ of the light-emitting layer 105. From this standpoint, for example, when 9,10-di(2-naphthyl)anthracene (ADN) (Ip=5.8 eV) is used as the host material of the light-emitting layer, it is desirable that the hole transport layer 104 be produced using a material such as NPB (Ip=5.4 eV), spiro-TAD (Ip=5.4 eV), p-TTA (Ip=5.6 eV), m-MTDAPB (Ip=5.7 eV), and TCTA (Ip=5.7 eV).

[Light-Emitting Layer 105]

In the light-emitting layer 105, excitons are generated by recombination of holes injected from the positive electrode 102 and electrons injected from the negative electrode and light is emitted during relaxation of the excitons. The light-emitting layer 105 can be produced from a material selected accordingly to the desired color tone. For example, in order to form the light-emitting layer 105 emitting light within a range of from blue color to bluish green color, it is possible to use a fluorescent whitening agent of a benzotriazole system, benzimidazole system, or benzoxazole system, a styrylbenzene compound, and an aromatic dimethylidene compound. Alternatively, the light-emitting layer 105 may be provided by using these materials as a host material and adding a dopant having a desired optical band gap. For example, perylene (blue color) that has been known to be used as a laser colorant can be used as the dopant.

When the light-emitting layer 105 is in contact with the hole injection layer 103, as in the above-described (A), (B), and (D) configurations, the HOMO level $E_{EMV}$ of the light-emitting layer 105 is $E_{NV}$ and has to satisfy the aforementioned Formula (I). Further, in the case of this configuration, in order to prevent the electrons from flowing out of the light-emitting layer 105 into the hole injection layer 103, it is preferred that the LUMO level $E_{EMC}$ of the light-emitting layer 105 be shallower than the LUMO level $E_{ETC}$ of the adjacent electron injection layer or electron transport layer 106 on the side opposite that of the hole injection layer 103 or shallower than the Fermi level $E_{F'}$ of the negative electrode 107 (Formula (VI) or Formula (VII)) and that the hole-electron recombination site (exciton generation site) be close to the interface on the side opposite that of the interface of the light-emitting layer 105 with the hole injection layer 103.

$$|E_{ECT}| \geq |E_{EMC}| \quad (VI)$$

$$|E_{F'}| > |E_{EMC}| \quad (VII)$$

[Electron Transport Layer 106]

The electron transport layer 106 serves to transmit the electrons injected from the negative electrode 107 or electrons injected from the negative electrode 107 via an electron injection layer (not shown in the figure) into the light-emitting layer 105. The electron transport layer 106 may be provided selectively. The electron transport layer 106 can be formed using an oxadiazole derivative such as 2-(4-biphenylyl)-5-(4-t-butylphenyl)-1,3,4-oxadiazole (PBD), and 1,3,5-tris(4-t-butylphenyl-1,3,4-oxadiazolyl)benzene (TPOB), a triazole derivative such as 3-phenyl-4-(1'-naphthyl)-5-phenyl-1,2,4-triazole (TAZ), a triazine derivative, a phenylquinoxaline, a thiophene derivative such as 5,5'-bis(dimesitylboryl)-2,2'-bithiophene (BMB-2T) and 5,5'-bis(dimethylboryl)-2,2':5'2'-terthiophene (BMB-3T), and an aluminum complex such as aluminum tris(8-quinolinolate) ($Alq_3$).

[Electron Injection Layer]

The electron injection layer (not shown in the figure) serves to enhance the injection of electrons from the negative electrode 107 and transmit the injected electrons to the electron transport layer 106 or light-emitting layer 105. The electron injection layer 1 may be provided selectively. The electron injection layer is typically produced using an alkali metal oxide such as $Li_2O$ and $Na_2O$; an alkali metal chalcogenide such as $Na_2S$ and $Na_2Se$; an alkali earth metal oxide such as CaO, BaO, SrO, and BeO; an alkali earth metal chalcogenide such as BaS and CaSe; an alkali metal halide such as LiF, NaF, KF, CsF, LiCl, KCl, and NaCl; an alkali earth metal halide such as $CaF_2$, $BaF_2$, $SrF_2$, $MgF_2$, and $BeF_2$, or an alkali metal carbonate such as $Cs_2CO_3$.

Alternatively, the electron injection layer may be produced by doping a material for the above-described electron transport layer 106 with an alkali metal such as Li, Na, K, and Cs, an alkali metal halide such as LiF, NaF, KF, and CsF, or an alkali metal carbonate such as $Cs_2CO_3$.

REFERENCE EXAMPLES

Reference Example 1

The object of the present reference example is to verify the height of carrier mobility in the hole injection layer used in the organic EL device in accordance with the present invention. An IZO film with a thickness of 110 nm was formed on a glass substrate (length 50 mm×width 50 mm×thickness 0.7 mm; Corning 1737 glass) by using a DC magnetron sputtering method (target: $In_2O_3$+10 wt. % ZnO, discharge gas: Ar+0.5 vol. % $O_2$, discharge pressure: 0.3 Pa, discharge power: 1.45 W/cm², substrate conveying rate 162 mm/min). An IZO electrode was then formed by processing the obtained IZO film by photolithography to a stripe shape with a width of 2 mm.

An NPB-doped HAT-6CN film with a thickness of 100 nm was then formed by resistance heating vapor deposition of HAT-6CN (Ip≈5.8 eV) and NPB (Ip=5.4 eV) simultaneously on the IZO electrode. In this case, the vapor deposition rate of HAT-6CN was set to 1 Å/s and the vapor deposition rate of NPB was set to 0.25 Å/s. The content of NPB in the obtained NPB-doped HAT-6CN film calculated from a film thickness ratio was about 10 mol % based on the total number of molecules in the film.

Gold was then vapor deposited at a rate of 0.5 Å/s through a metal mask having a slit-like opening with a width of 2 mm, without breaking the vacuum, a gold electrode with a film thickness of 20 nm and a width of 2 mm was formed, and a model device was obtained.

Reference Example 2

A model device was obtained by repeating the procedure of Reference Example 1, except that the NPB deposition rate was set to 1.75 Å/s. The content of NPB in the obtained NPB-doped HAT-6CN film calculated from a film thickness ratio was about 45 mol % based on the total number of molecules in the film.

Comparative Example 1

An IZO electrode was formed by a procedure similar to that of Reference Example 1. Then, only HAT-6CN was vapor deposited at a rate of 1 Å/s on the IZO electrode and a HAT-6CN film with a thickness of 100 nm was formed. A gold electrode was then formed by the procedure similar to that of Reference Example 1 and a model device was then obtained.

<Evaluation 1>

Figure 7:
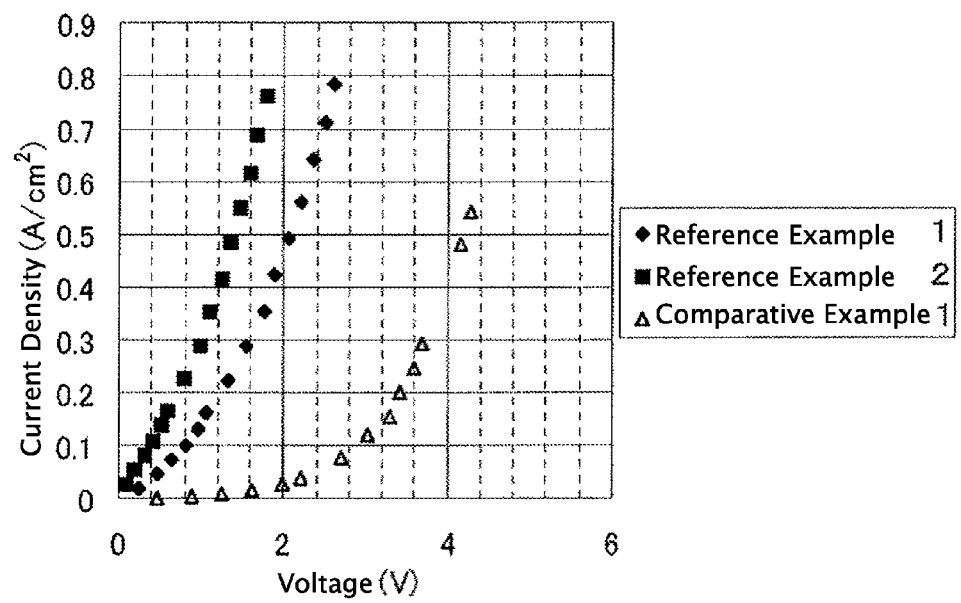
FIG. 7 is a graph illustrating a current-voltage characteristic of organic EL devices of Reference Examples 1 and 2 and Comparative Example 1.

The IZO electrodes of model devices of Reference Examples 1 and 2 and Comparative Example 1 were used as positive electrodes, a voltage was applied such that the gold electrode was a negative electrode, and a current-voltage characteristic was measured. The results are shown in FIG. 7. FIG. 7 demonstrates that electric current can flow easily in the NPB-doped HAT-6CN films of Reference Examples 1 and 2 than in the HAT-6CN film of Comparative Example 1. Thus, it is clear that the NPB-doped HAT-6CN film has a carrier mobility (hole mobility) higher than the undoped HAT-6CN film. Further, the comparison of Reference Examples 1 and 2 demonstrates that the carrier mobility increases due to the increase in NPB content in the guest material.

Example 1

Corning 1737 glass (length 50 mm×width 50 mm×thickness 0.7 mm) was used as the substrate 101. An IZO film with a thickness of 110 nm was formed on the substrate 101 by using a DC magnetron sputtering method (target: $In_2O_3$+10 wt. % ZnO, discharge gas: Ar+0.5 vol. % $O_2$, discharge pressure: 0.3 Pa, discharge power: 1.45 W/cm$^2$, substrate conveying rate 162 mm/min). A positive electrode 102 with a film thickness of 110 nm and a width of 2 mm was then formed by processing the obtained IZO film by photolithography to a stripe shape with a width of 2 mm.

A hole injection layer 103 composed of a NPB-doped HAT-6CN film with a thickness of 200 nm was then formed on the positive electrode 102 by resistance heating vapor deposition of HAT-6CN and NPB simultaneously. In this case, the deposition rate of HAT-6CN was set to 1 Å/s and the deposition rate of NPB was set to 0.9 Å/s. The content of NPB in the obtained hole injection layer 103 calculated from a volume ratio was about 30 mol % based on the total number of molecules in the hole injection layer 103. In this case, the LUMO level ($E_{HIC}$) of the HAT-6CN, which was the host material, was about −5.8 eV. The HOMO level ($E_{GV}$) of the NPB, which was the guest material, was −5.4 eV.

Further, the hole transport layer 104 with a film thickness of 20 nm that was composed of NPB, the light-emitting layer 105 with a film thickness of 25 nm that was composed of 4,4'-bis(2,2'-diphenylvinyl)biphenyl (DPVBi), and the electron transport layer 106 with a film thickness of 20 nm that was composed of Alq3 were successively formed by the resistance heating vapor deposition method on the hole injection layer 103. All these layers were formed at a deposition rate of 1 Å/s. In this case, the HOMO level ($E_{NV}$=$E_{HTV}$) of the NPB, which was the material of the hole transport layer 104, was −5.4 eV and the LUMO level ($E_{HTC}$) was −2.4 eV. The LUMO level ($E_{EMC}$) of DPVBi, which was the material of the light-emitting layer 105, was −2.9 eV.

LiF was thermally evaporated at a deposition rate of 0.2 Å/s on the electron transport layer 106 by the resistance heating vapor deposition method and an electron injection layer with a thickness of 1 nm was formed. Finally, the negative electrode 107 with a film thickness of 100 nm was formed by thermally evaporating Al at a deposition rate of 2 Å/s through a metal mask having a slit-shaped opening with a width of 2 mm on the electron injection layer by using the resistance heating vapor deposition method.

The laminate in which the negative electrode 107 and underlying layers have been formed was transported into a nitrogen-substituted dry box, without exposing the laminate to the atmosphere. A sealing glass plate (length 41 mm×width 41 mm×thickness 1.1 mm, OA-10 manufactured by Nippon Electric Glass Co., Ltd.) that was coated with an epoxy adhesive in the vicinity of four sides was attached to the substrate such as to cover the negative electrode 107 and underlying layers in the dry box and an organic EL device was obtained.

Comparative Example 2

The procedure of example 1 was repeated, except that a HAT-6CN film with a thickness of 200 nm was formed as a hole injection layer, and an organic EL device was obtained.

<Evaluation 2>

Figure 8:
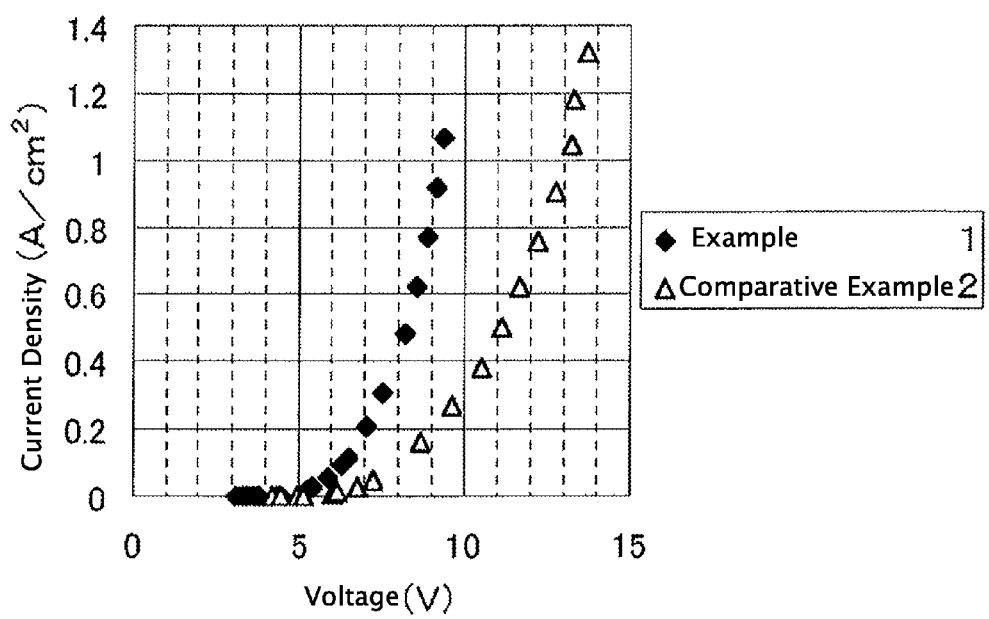
FIG. 8 is a graph illustrating a current-voltage characteristic of organic EL devices of Example 1 and Comparative Example 2.
Figure 9:
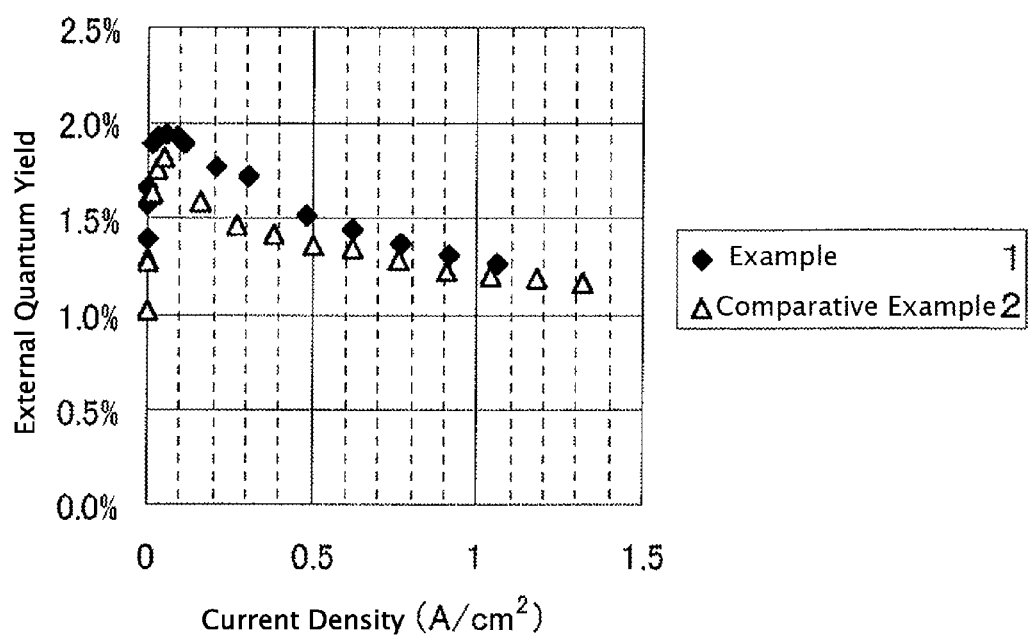
FIG. 9 is a graph illustrating a current density—external quantum yield characteristic of organic EL devices of Example 1 and Comparative Example 2.

A current-voltage characteristic of the organic EL devices of Example 1 and Comparative Example 2 was measured. The results are shown in FIG. 8. A characteristic showing the dependence of the external quantum yield on electric current obtained under an assumption that the angular dependence of emission luminance follows the Lambertian rule is shown in FIG. 9.

As follows from FIG. 8, the driving voltage of the organic EL device of Example 1 having the hole injection layer 103 composed of the NPB-doped HAT-6CN film is lower than that of the organic EL device of Comparative Example 2 having the hole injection layer composed solely of HAT-6CN by about 4 V at a current density of 1 A/cm$^2$ and by about 1.5 V at a current density of 0.1 A/cm$^2$. Meanwhile, FIG. 9 demonstrates that the external quantum yields of the organic EL devices of Example 1 and comparative example 2 are almost equal to each other. This result clearly demonstrates that the present invention makes it possible to lower the drive voltage, without affecting the emission characteristic of the organic EL device, by using the hole injection layer obtained by doping a host material having a deep LUMO level with a guest material.

The invention claimed is:

1. An organic EL device comprising a substrate, a pair of electrodes provided on the substrate, and an organic EL layer sandwiched by the pair of electrodes, wherein the pair of electrodes includes a positive electrode and a negative electrode, the organic EL layer includes at least a light-emitting layer and a hole injection layer that is in contact with the positive electrode, the hole injection layer is formed of an n-type semiconductor host material and a p-type semiconductor guest material, and a LUMO level $E_{HIC}$ of the host material and a HOMO level of the guest material or a valence band level satisfy:

$$|E_{HIC}|+0.5 \text{ eV} \geq |E_{GV}| > |E_{HIC}|-0.6 \text{ eV}.$$

2. The organic EL device according to claim 1, wherein a LUMO level $E_{HIC}$ of the host material of the hole injection layer and a HOMO level $E_{EMV}$ of the light-emitting layer adjacent to the hole injection layer satisfy the relationship:

$$|E_{HIC}| > |E_{EMV}|-1.0 \text{ eV}.$$

3. The organic EL device according to claim 1, further comprising a hole transport layer between the hole injection layer and the light-emitting layer, wherein a conduction band level $E_{HIC}$ or LUMO level of the host material of the hole injection layer and a HOMO level $E_{HTV}$ of the hole transport layer adjacent to the hole injection layer satisfy the relationship:

$$|E_{HIC}| > |E_{HTV}|-1.0 \text{ eV}.$$

4. The organic EL device according to claim 3, wherein a LUMO level of the hole transport layer is higher than a LUMO level of the light-emitting layer.

5. The organic EL device according to claim 1, wherein a LUMO level $E_{HIC}$ of the host material of the hole injection layer and a HOMO level $E_{GV}$ of the guest material of the hole injection layer satisfy the relationship:

$$|E_{HIC}| \geq |E_{GV}| > E_{HIC}| - 0.6 \text{ eV}.$$

6. The organic EL device according to claim 5, wherein the absolute value $|E_{HIC}|$ of the conduction band level $E_{HIC}$ or LUMO level of the host material of the hole injection layer is equal to or higher than 5.0 eV.

7. The organic EL device according to claim 1, wherein a concentration of the guest material of the hole injection layer is equal to or less than 50 mol % based on the total number of molecules in the hole injection layer.

8. The organic EL device according to claim 1, wherein the host material of the hole injection layer is a hexaazatriphenylene derivative having a structure represented by the following Formula (1):

[C1]

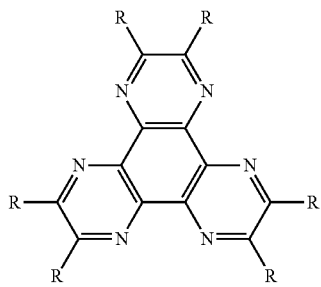
(1)

(where R is selected, in each appearance thereof, from the group consisting of a hydrogen atom, a hydrocarbon group having 1 to 10 carbon atoms, a halogen, an alkoxy group, an arylamino group, an ester group, an amido group, an aromatic hydrocarbon group, a heterocyclic group, a nitro group, and a cyano group).

9. The organic EL device according to claim 8, wherein the host material of the hole injection layer is hexaazatriphenylene hexacarbonitrile having a structure represented by the following Formula (2):

[C2]

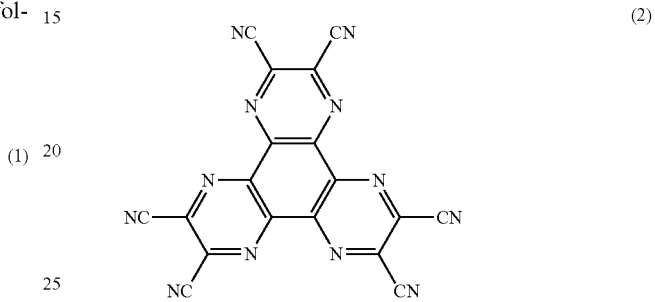
(2)

10. The organic EL device according to claim 1, wherein the host material of the hole injection layer is selected from the group consisting of molybdenum oxide ($MoO_3$), tungsten oxide ($WO_3$), and vanadium oxide ($V_2O_5$).

* * * * *